United States Patent [19]

Kawakami et al.

[11] Patent Number: 5,523,677
[45] Date of Patent: Jun. 4, 1996

[54] DC CURRENT SENSOR

[75] Inventors: Makoto Kawakami, Suita; Shigeru Yamaguchi, Osaka, both of Japan

[73] Assignee: Sumitomo Special Metals Co., Ltd., Osaka, Japan

[21] Appl. No.: 321,792

[22] Filed: Oct. 12, 1994

[30] Foreign Application Priority Data

Oct. 12, 1993 [JP] Japan .................... 5-280104

[51] Int. Cl.$^6$ ............................................. G01R 33/00
[52] U.S. Cl. .......................... 324/117 R; 324/127; 330/8; 307/416
[58] Field of Search .............................. 324/117 R, 127; 330/8; 307/416

[56] References Cited

U.S. PATENT DOCUMENTS

| | | | |
|---|---|---|---|
| 3,007,106 | 10/1961 | Bergh et al. | 324/127 |
| 3,284,710 | 11/1966 | Schroeder | 324/127 |
| 4,182,982 | 1/1980 | Wolf et al. | 324/127 |
| 4,706,017 | 11/1987 | Wilson | 324/127 |
| 5,296,802 | 3/1994 | Beranger et al. | |

FOREIGN PATENT DOCUMENTS

| | | |
|---|---|---|
| 47-1644 | 1/1972 | Japan . |
| 53-31176 | 8/1978 | Japan . |
| 59-46859 | 11/1984 | Japan . |

Primary Examiner—Kenneth A. Wieder
Assistant Examiner—Kourosh Cyrus Khosravi
Attorney, Agent, or Firm—Watson Cole Stevens Davis

[57] ABSTRACT

A DC current sensor has a detecting core with a plurality of detecting core members adapted to be divided in a circumferential direction for receiving the lead wire. A pair of annular exciting cores on one of said detecting core members formed of saturable magnetic material has a core intersection inter-connected perpendicularly to the circumferential direction of said detecting core members, and are disposed oppositely in spaced relation with said detecting core members to magnetically saturate a portion thereof by a magnetic flux produced substantially in the perpendicular direction against a magnetic flux in the circumferential direction, produced by the DC current flowing through said lead wire being detected, and to interrupt a magnetic path by the magnetic flux in the circumferential direction periodically. Exciting coils are wound around the exciting cores in negative-phase excitation.

14 Claims, 12 Drawing Sheets

DC CURRENT SENSOR

BACKGROUND OF THE INVENTION

1. Field of the Invention

The present invention relates to a DC current sensor used in a DC leakage breaker and the like, and, particularly, it relates to a highly versatile DC current sensor, having a relatively simple construction and a good detecting capability against microscopic current variation, which can be mounted very easily to a wired lead being detected for realizing a stable detection.

2. Description of the Prior Art

In recent years, though equipments using a DC current such as electric appliances incorporating an inverter, electromobiles and the like are increased, requirements on a sensor which detects load of DC motors built in the various equipments for necessary control, and a DC current sensor used in a DC leakage breaker and the like are enhanced.

As the current sensor used in an AC leakage breaker and the like, those applying a current transformer is widely known.

However, this configuration can not be adopted in the leakage breaker used in the aforementioned equipments using the DC current, and hence, a conventionally known shunt resistance method, magnetic amplifier method, magnetic multi-vibrator method (Japanese Patent Application Laid Open Nos. Sho 47-1644, Sho 53-31176, Sho 59-46859), hall device and the like have been studied for utilization.

The shunt resistance method is a method for detecting a potential difference produced at opposite end portions of the shunt resistance which is disposed in series in the lead wire being detected.

In the magnetic amplifier method and the magnetic multi-vibrator method, a core made of a soft magnetic material constituted by winding a detecting coil in a toroidal shape is used, wherein the lead wire being detected is extended through the core for DC magnetic deflection of the core made of the soft magnetic material, within a saturated magnetic flux density (Bs), by the DC current flowing through the lead wire being detected, thereby imbalance is produced in a time the alternating magnetic flux produced by applying the AC current to a coil wound on the core in advance reaching saturation in the positive and negative direction, to detect the variation by the detecting coil. Though the magnetic amplifier method is constituted such that, in order to give the magnetic flux variation in the core in advance, an exciting coil is wound on the core to apply the AC current having a predetermined value, the magnetic multi-vibrator method is constituted such that, the self-oscillation takes place by the operation of a semiconductor and the like in a circuit connected to the detecting coil, and a duty ratio of the oscillation waveform is changed responsive to the electric current being detected for oscillation.

Furthermore, the hall device method is constituted such that, the lead wire being detected is wound in a toroidal shape directly around the core made of soft magnetic material, whereon a gap portion for disposing the hall device is formed partly, and the magnetic flux variation in the core responsive to the variation in the DC current flowing through the lead wire being detected is detected directly by the hall device.

However, the DC current sensors consisting of the above-mentioned methods are difficult to respond to a microscopic current variation of the DC leakage breaker and the like by the following reasons, and at present, they are not practically used as the sensitive DC current sensor.

That is, in the shunt resistance method, since the shunt resistance itself is disposed, as an electrical resistance, in a circuit including the lead wire being detected, an electrical loss in the circuit increases and an electrical efficiency is deteriorated.

Likewise, since a detecting circuit for detecting the potential difference produced at opposite ends of the electrical resistance is directly connected to the lead wire being detected, the detecting circuit and the lead wire being detected are difficult to be insulated electrically, and for example, the detecting circuit and an applied circuit such as a microcomputer control circuit, and the like can not be connected directly, results in a poor versatility.

Besides they disadvantages, though two shunt resistances must be disposed in the circuit of the lead wire being detected in order to adopt the shunt resistance method in the leakage breaker, it is, in fact, difficult to make characteristics of the respective shunt resistances uniform, thus a precise measurement of the potential difference can not be realized.

Besides, in order to detect a small leakage by comparing the potential difference measured by the detecting circuit connected to the respective shunt resistances, it is necessary to connect the respective detecting circuits through a very complicated electric circuit, thus it is difficult to provide as the highly practical DC current sensor.

In the magnetic amplifier method and the magnetic multi-vibrator method, though the detecting circuit and the lead wire being detected can be insulated electrically, as previously described, the core made of the soft magnetic material must be magnetically deflected by the DC current flowing through the lead wire being detected, so as to be saturated substantially near to the saturated magnetic flux density (Bs). When using the known soft magnetic material such as a permalloy as the core, and for example, the electric current flowing through the lead wire being detected is about several tens of mA, the lead wire being detected must be wound around the soft magnetic material core by several tens to several hundreds of turns or more, thus, originally, it was difficult to be used as the DC current sensor for the leakage breaker and the like requiring one through turn of the lead wire being detected.

Also in the hall device method, since the detecting capability is inevitably decided by characteristics of the hall device, when the hall device known at present is used, and for example, the electric current flowing through the lead wire being detected is about several tens of mA, the lead wire being detected must be wound around the soft magnetic material core above several hundreds to several thousands of turns, thus, similar to the magnetic amplifier method an the magnetic multi-vibrator method, it was difficult to be used as the DC current sensor for the leakage breaker and the like requiring one through turn of the lead wire being detected.

SUMMARY OF THE INVENTION

It is object of the present invention to provide a sensitive DC current sensor, which selves the above-mentioned problems, having a relatively simple construction and a good detecting capability for a DC leakage breaker an the like, particularly, against a microscopic current variation.

It is, particularly, another object of the present invention to provide a versatile DC current sensor, which is very simple to mount to a wired lead being detected.

The inventors have, taking notice of the fact that, when a lead wire being detected is extended through a detecting core consisting of an annular soft magnetic material, around which a detecting core is wound in a toroidal shape, and applying a DC current therethrough, though a clockwise magnetic field is generated against the direction of the DC current and a magnetic flux $\Phi_0$ is produced in the detecting core, since the electric current flowing through the lead wire being detected is the DC current, the magnetic flux $\Phi_0$ is constant and an electromotive force is not produced in the detecting coil, studied to produce the electromotive force in the detecting coil, by forming a magnetic gap partly in the detecting core, which is open and closed by a magnetic body to constitute a magnetic switch, and changing (ON-OFF) the magnetic flux $\Phi_0$ with time by the magnetic switch.

Furthermore, as the result of various studies to make the above-mentioned configuration more realistic, the inventors have confirmed that, this object can be achieved by disposing means for partly forming the magnetic gap periodically in the detecting core being the magnetic flux generated in a substantially perpendicular direction, against the magnetic flux generated in a circumferential direction in the detecting core by the DC current flowing through the lead wire being detected in place of the mechanical magnetic switch, and realizing the operation substantially similar to the aforesaid magnetic switch.

As the specific configuration, it can be constituted such that, besides disposing an exciting core consisting of the soft magnetic material connected perpendicularly to the circumferential direction of the detecting core to form an annular shape, on a portion of the detecting core in a body, the exciting coil is wound on the exciting core in a toroidal shape, and further, the exciting core is excited in a perpendicular direction against the circumferential direction of the detecting core by applying the DC current to the exciting coil to magnetically saturate the intersection of the detecting coil and the exciting core periodically, thereby the magnetically saturated intersection is formed substantially into the magnetic gap.

That is, by the fact that a relative permeability $\mu$ of the magnetically saturated intersection of the detecting core approaches to 1 endlessly, the magnetically saturated portion functions as same as the magnetic gap, the magnetic flux $\Phi_0$ in the detecting core reduces at a constant period and the electromotive force can be produced in the detecting coil with changes in the magnetic flux.

The inventors have made various improvements on the DC current sensor consisting of the aforementioned basic configuration, and in order to mount the DC current sensor simply to the wired lead, particularly, in such a way that the detecting core can be divided, at least, at one portion in the circumferential direction at the time of disposing the lead wire being detected therethrough, a plurality of detecting core members are used and the exciting core, exciting coil and detecting coil are disposed effectively on one of the detecting core members to achieve the object.

That is, the DC current sensor of the present invention comprises, a detecting core consisting of an annular soft magnetic material, wherein a lead wire being detected, through which a DC current flows for detection without contact, is disposed, and the detecting core is consisting of a plurality of detecting core members which can be divided, at least, at one portion in a circumferential direction at the time of disposing the lead wire being detected therethrough, on one of the detecting core members, at least, a pair of exciting cores consisting of the soft magnetic material forming an annular shape by providing a core intersection connected perpendicularly to the circumferential direction of the detecting core members are disposed oppositely via the detecting core members, so as to magnetically saturate a portion of the detecting core members by a magnetic flux produced substantially in a perpendicular direction against a magnetic flux in the circumferential direction produced by the DC current flowing through the lead wire being detected, and to interrupt a magnetic path by the magnetic flux in the circumferential direction periodically. Furthermore, exciting coils are wound around the exciting cores, the respective exciting coils are connected for negative-phase excitation, or the respective exciting coils are connected such that, the exciting current having the relative phase difference of 90° can be applied, and the detecting coil is wound around the exciting core in a toroidal shape in a body The DC current sensor of the present invention comprises, a detection core which is constituted by a plurality of detecting core members so as to be divided, at least, at one portion in the circumferential direction at the time of disposing the lead wire being detected therethrough, wherein by integrating the exciting core, exciting coil and detecting coil effectively with one of the detecting core members, interconnection between the other detecting core members is not necessary, thus it is easy to mount to the wired lead being detected, and the possibility of breaking the wire at mounting can be largely reduced, thus a reliable mounting of the DC current sensor can be realized.

Since the DC current sensor of the present invention has a good detecting capability against a microscopic current variation as shown in the embodiment, when used in the DC leakage breaker and the like, a required sensitive detection can be achieved by extending only one lead wire being detected through the detecting core, thus the construction is relatively simple and the DC current sensor can be made smaller.

Besides, not only an absolute value of the DC current flowing through the lead wire being detected, but also its direction can be detected, so that it can be used more effectively in a technical field, where controls such as positive rotation $\mu$ reverse rotation or forward $\mu$ backward such as the control of an actuator using a DC motor are necessary, due to the direction of the DC current.

BRIEF DESCRIPTION OF THE DRAWINGS

FIG. 12 is a graph showing the relationship between frequencies applied in a DC current sensor configuration shown in FIG. 10, wherein FIG. 12(A) shows the relationship between the frequency and an exciting current FIG. 12(B) shows the relationship between the frequency and a magnetic flux passing a detecting core, and FIG. 12(C) shows the relationship between the frequency and an electromotive force of a detecting coil.

FIG. 13 is a graph showing the relationship between frequencies applied in the DC current sensor configuration shown in FIG. 10, wherein FIG. 13(A) shows the relationship between the frequency and an exciting current, FIG. 13(B) shows the relationship between the frequency and a magnetic flux passing a detecting core, and FIG. 13(C) shows the relationship between the frequency and an electromotive force of a detecting coil.

DETAILED DESCRIPTION OF THE PREFERRED EMBODIMENTS

In the following, the operation of a DC current sensor of the present invention is particularly described based on the drawings.

As previously described, though the DC current sensor of the resent invention is characterized in that, a detecting core is consisted by a plurality of detecting core members so as to be divided, at least, at one portion in a circumferential direction of the detecting core at the time of disposing a lead wire being detected therethrough, as to its basic principle of operation, it is substantially same regardless of whether the detecting core is divided or not. Also, for the purpose of describing the details on completion of the present invention more clearly, n the following description, the basic operational principle is, first, described based on the configuration in which the detecting core is not divided.

Figure 11:
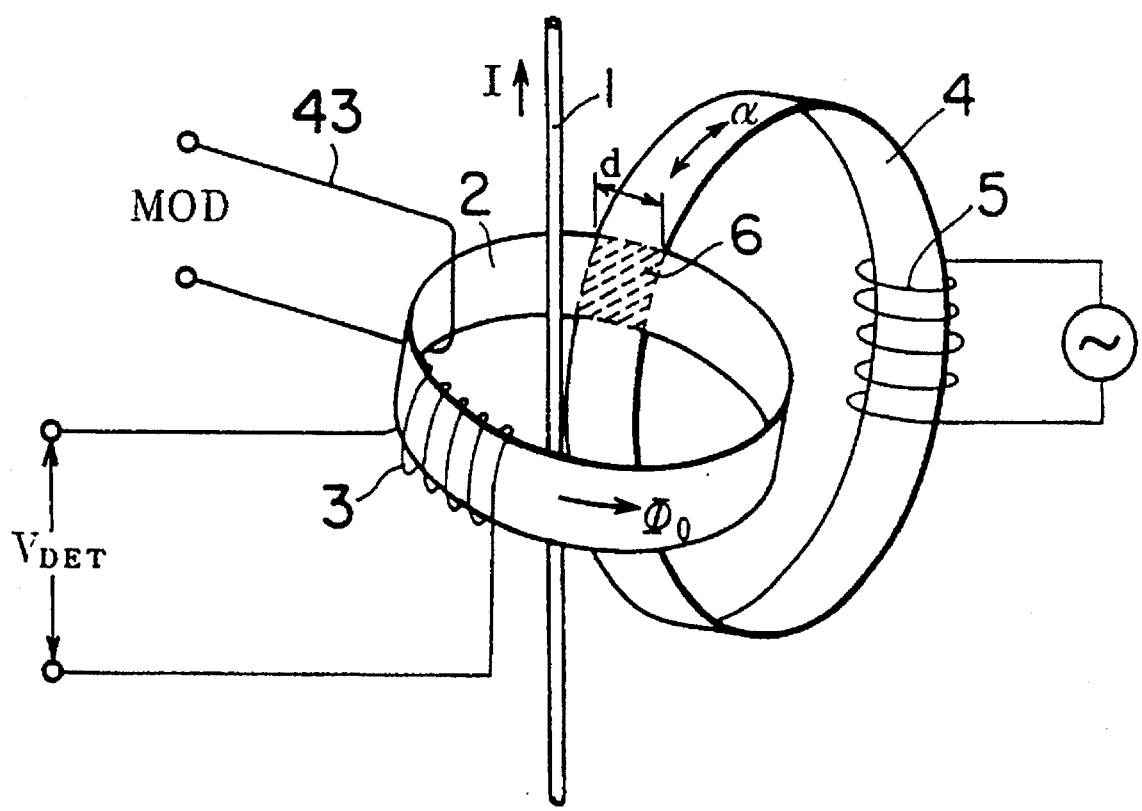
FIG. 11 is a perspective explanatory view showing an outline of a DC current sensor invented before inventing a DC current sensor of the present invention.
Figure 12:
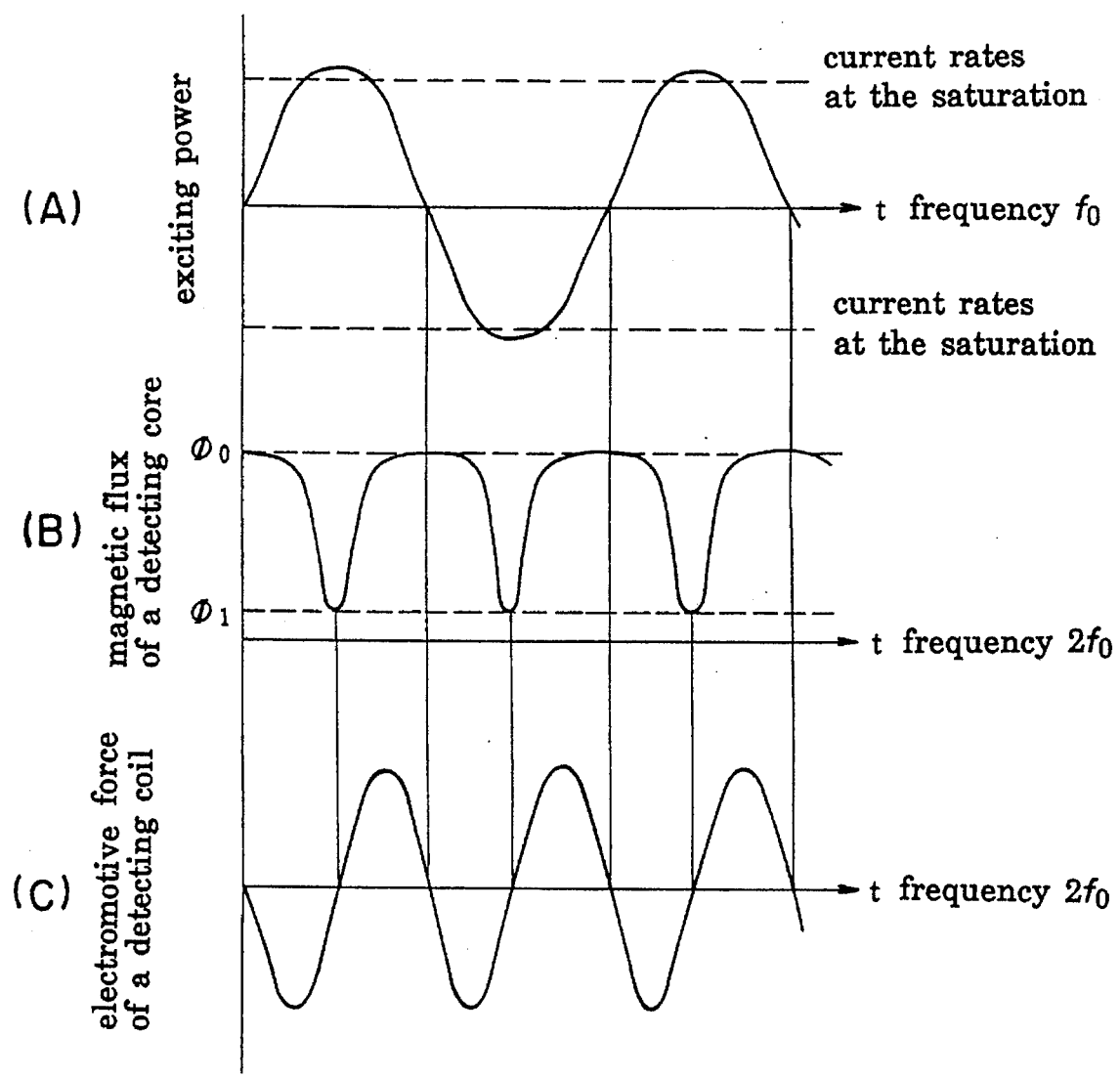
Figure 13:
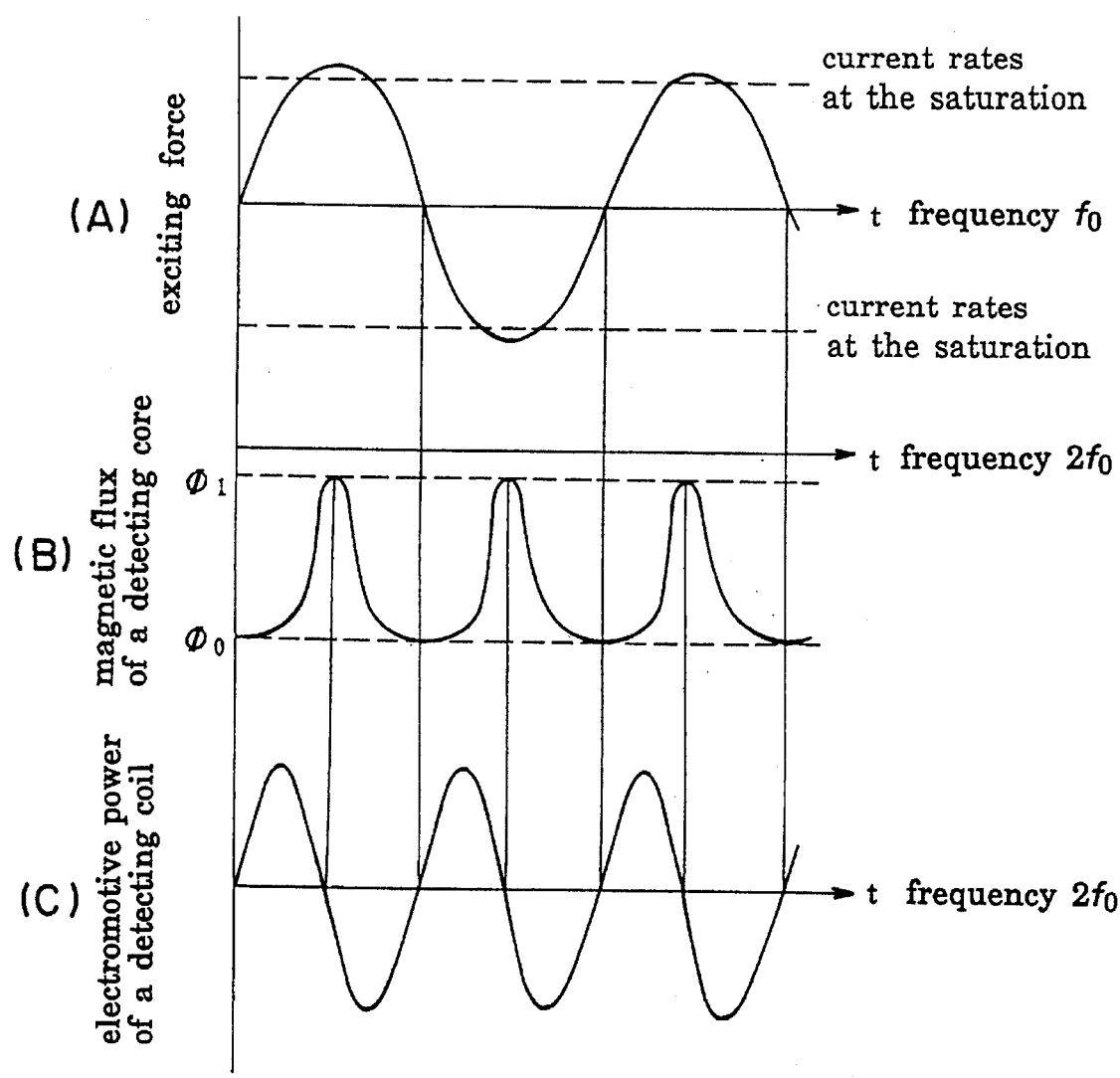

FIG. 11 is a perspective explanatory view for explaining the basic principle of operation of a DC current sensor of the present invention. FIG. 12 and FIG. 13 show the relationship between an exciting current and a magnetic flux passing a detecting core and an electromotive force produced in a detecting coil in this configuration.

In FIG. 11, numeral 1 designates a lead wire being detected disposed through the detecting core 2 consisting of an annular soft magnetic material. Numeral 3 designates a detecting coil wound around a predetermined position of the detecting core 2 in a toroidal shape, and connected to a predetermined detecting circuit (not shown) as securing an electrical insulation with the lead wire being detected 1.

Numeral 4 designates an exciting core consisting of the annular soft magnetic material, wound which an exciting coil 5 is wound in a toroidal shape at a predetermined position. The exciting core 4 is connected perpendicularly to the detecting core 2 at a portion in a circumferential direction thereof, and by the operation to be described later, forms an magnetically saturated portion at a shaded portion in the figure, or at a core intersection 6 of the detecting core 2 ad the exciting core 4.

In the figure, numeral 43 designates a modulation coil which is disposed in the same direction as the lead wire being detected 1, for the purpose of reducing an output characteristic hysteresis which is assumed to be caused by the effect of magnetic characteristic (coercive force) of the soft magnetic material constituting the detecting core 2.

In the configuration shown in FIG. 11, when a DC current I flows through the lead wire being detected 1, a clockwise magnetic field is generated in the detecting core 2 against the direction of the DC current I, thereby a magnetic flux $\Phi_0$ is produced in the detecting core 2.

At this time, when a predetermined AC current is applied to the exciting coil 5 to produce the magnetic flux, which changes in a direction α periodically, in the exciting core 4, and to magnetically saturate the exciting core 4 periodically, a relative permeability μ drops nearly to 1, and the core intersection 6 (a shaded portion) which is a circumferential portion of the detecting core 2 substantially forms a so-called magnetic gap, and the magnetic flux $\Phi_0$ in the detecting core 2 is reduced to $\Phi_1$.

Hereupon, when the exciting core 4 is saturated near a peak value of the AC current of frequency $f_0$ applied to the exciting coil 5, both in the case of DC current I flowing through the lead wire being detected 1 is in a positive (+) direction (upward in the figure) as shown in FIG. 12, and in the case of the DC current I flowing through the lead wire being detected 1 is in a negative (−) direction (downward in the figure) as shown in FIG. 13, the exciting core 4 is saturated twice in one exciting current period.

In the case of positive (+) direction (upward in the figure) of the DC current I flowing through the lead wire being detected 1 as shown in FIG. 12, by this saturation, the magnetic flux $\Phi_0$ produced in the detecting core 2 by the DC current I flowing through the lead wire being detected is reduced to $\Phi_1$ at the frequency of $2f_0$ as shown in FIG. 12(B). That is, modulation takes place at $2f_0$. Thus, a voltage $V_{DET}$ of frequency $2f_0$ is produced in the detecting coil 3, as shown in FIG. 12 (C), as the magnetic flux changes.

Also, in the case of the DC current I flowing through the lead wire being detected 1 is in the negative (−) direction (downward in the figure) as shown in FIG. 13, though the operation is substantially same as the case of positive (+) direction (upward in the figure) of the DC current I, due to the fact that the direction of the DC current I is in reverse, the direction of the magnetic flux produced in the detecting core 2 is also in reverse and a phase difference of the voltage $V_{DET}$ of frequency $2f_0$ produced in the detecting coil 3 becomes 180°.

However, regardless of the direction of the DC current I flowing through the lead wire being detected 1, in either case, voltage $V_{DET} \propto$ DC current I from the relationship of magnetic flux $\Phi_0 \propto$ DC current I and voltage $V_{DET} \propto$ magnetic flux $\Phi_0$, thus the electromotive force proportional to the DC current I flowing through the lead wire being detected 1 can be detected by the detecting coil 3, and an absolute value of the DC current I flowing through the lead wire being detected 1 can be known.

Furthermore, since the detecting core 2 and the exciting core 4 are connected perpendicularly, and basically, the exciting magnetic flux in the exciting core 4 does not leak to the detecting core 2 and pass through the detecting coil 3, the electromotive force by the exciting current applied to the exciting coil 5 is not produced in the detecting coil 3, and when the DC current I flowing through the lead wire being detected 1 is 0, $V_{DET}=0$.

Since the frequency of the electromotive force $V_{DET}$ produced in the detecting coil 3 is $2f_0$ and different from the frequency $f_0$ of the exciting current applied to the exciting coil 5, even when the exciting magnetic flux in the exciting core 4 leaks due to the accuracy of shapes, sizes and so on of the detecting coil 2 and the exciting coil 4, and is detected by the detecting coil 3, since the frequency of a leakage component is $f_0$ and can be easily separated by a frequency discriminating filter and the like, it can be used as a sensitive DC current sensor.

As the result of study made on the DC current sensor having the above-mentioned configuration to enable detection of the microscopic currents, it has been confirmed that, a so-called hysteresis phenomenon, where an output voltage (electromotive force) in the detecting coil is different, is produced, even at the same current value when the DC current increases or reduces, in a microscopic current region, where the DC current flowing through the lead wire being detected 1 is, for example, about ±50 mA or less, even when using permalloy C (78% Ni-5Mo-4Cu-balFe) known as a material of a high relative permeability as the detecting core 2, and particularly, when the DC current is around zero (±20 mA), an "inversion region", where the output voltage reduces as the DC current increases, is generated.

That is, when the DC current (current being detected) flowing through the lead wire being detected 1 is at zero, even when the above-mentioned is used as the detecting coil 2, since the coercive force of the material is finite, the magnetic flux remains in the core, and until the residual magnetic flux is eliminated by the current being detected, the "inverse region" according to the hysteresis phenomenon of the output voltage in the detecting coil in the microscopic current region is produced, and a reference level at the time of measurement fluctuates, thus at the measurement in the microscopic current region, measurement values differ at each time and the accurate value can not be obtained.

In order to solve such problems, as shown in FIG. 11, the modulation coil 43 wound in the same direction as the lead wire being detected 1 is disposed on the detecting core 2, and an alternating magnetic field produced by the modulation coil 43 is superposed on the detecting core 2, thereby the hysteresis of the output characteristic by residual magnetic flux of the core can be reduced.

Accordingly, when an AC current necessary to produce the magnetic field higher than a coercive force of the detecting core 2 is applied to the modulation coil 43, the hysteresis characteristic produced by the residual magnetic flux caused by the coercive force of the core material is eliminated, and a detecting sensibility at a microscopic current can be enhanced by removing the superposed alternating component by the detecting circuit.

Hereupon, the modulation coil 43 wound around the detecting core 2 in the same direction as the lead wire being detected 1 as such that, besides winding by one turn around the detecting core 2 so as to extend in the same direction as the lead wire being detected 1 as the embodiment shown in FIG. 11, it is wound by several turns in the same direction as aforementioned responsive to a necessary intensity of the alternating magnetic field, and particularly, in the case of winding by several turns, it is wound around the detecting core 2 in a toroidal shape as substantially same as the detecting coil 3.

As it is apparent from FIG. 11, since the modulating coil 43 is disposed substantially at the same location in the same direction as the detecting coil 3, which is wound around the detecting core 2 in a toroidal shape, the detecting coil 3 may be commonly used.

That is, since the frequency of the electric current flowing through the detecting coil 3 and that of the electric current flowing through the modulation coil 43 are, originally, different from one another largely, even when they are used commonly, an electric signal can be separated easily by arranging a filter, which passes the electric current composed, of the frequency realizing respective functions, adequately, thus even when the modulation coil 43 and the detecting coil 3 are integrated, the output characteristic hysteresis can be reduced.

Meanwhile, viewing the fact that the phase difference of the voltage $V_{DET}$ of frequency $2f_0$ produced in the detecting coil 3 depending on the direction of the DC current I flowing through the lead wire being detected 1 is 180° as described by FIG. 12 and FIG. 13, it has been confirmed that, and absolute value as well as the direction of the DC current flowing through the lead wire being detected 1 can be detected easily, by applying an exciting current in a state, where the frequency of the exciting current oscillated from an oscillator beforehand at the frequency of two times the exciting current is divided into half, and detecting the phase difference of the oscillator output and the detecting coil 3 output by a phase comparing circuit.

That is, since both the frequency of the exciting current oscillated from the oscillator connected to the exciting coil 5 and that of the output $V_{DET}$ from the detecting coil 3, finally, have the frequency $2f_0$ which is two times the exciting current applied to the exciting coil 5, the phase difference can be easily compared, and the absolute value as well as the direction of the DC current flowing through the lead wire being detected 1 can be detected.

Likewise, by applying an electric current, whose direction and intensity change linearly against time periodically, for example, the electric current which changes in a triangular waveform, to the detecting coil 3 to give a deflection magnetic field in the detecting core 2, the absolute value as well as the direction of the DC current flowing through the lead wire being detected 1 can be easily detected.

That is, when the electric current which changes, for example, in a triangular waveform, is applied to the detecting coil 3 in the state where the DC current flows through the lead wire being detected 1, a magnetic flux produced by the triangular waveform electric current and a magnetic flux produced by the DC current flowing through the lead wire being detected 1 are superposed in the detecting coil 3, thus the absolute value as well as the direction of the DC current flowing through the lead wire being detected 1 can be detected by, after applying a crest restriction to the electromotive force produced in the detecting coil 3, detecting the output phase and detecting a time ratio (duty ratio) between the positive (+) side output time and the negative (−) side output time.

Particularly, when a maximum value of the aforesaid electric current applied to the detecting coil 3 is sufficiently set to produce the magnetic field above a coercive force ($\alpha$Hc) of the material of the detecting core 2, the output characteristic hysteresis substantially caused by a hysteresis of the material of the detecting coil 2 can be reduced.

Furthermore, by combining various known electric circuits effectively, essential advantages of the DC current sensor constituted as shown in FIG. 11 can be practically used more effectively.

Meanwhile, based on the above-mentioned configuration, a pair of cylinders constituting an exciting core are disposed in parallel against the axis line, and adjoining sides of opening ends of the cylinders are connected in a body with connecting plates consisting of a soft magnetic material, to constitute the detecting core by the connecting plats and cylinder side faces connected thereto, thereby an electromagnetic imbalance as the DC current sensor and noises are reduced and an S/N ratio can be improved.

Also, by adopting the configuration of the exciting core constituted by a pair of cylinders disposed in parallel against the axis line, as compared with the configuration shown in FIG. 11, a width d (refer to FIG. 11) of a connection of the exciting core connected to the detecting core can be substantially lengthened, as a result, a ratio of width d of the connection of the exciting core against a magnetic path length of the detecting core (a magnetic gap ratio) is increased, a residual magnetic flux density in the detecting core is reduced by the effect of a demagnetizing field, and the effect of coercive force of the core material is reduced further by geometrical effects with the arrangement effect of the modulation coil.

Figure 14:
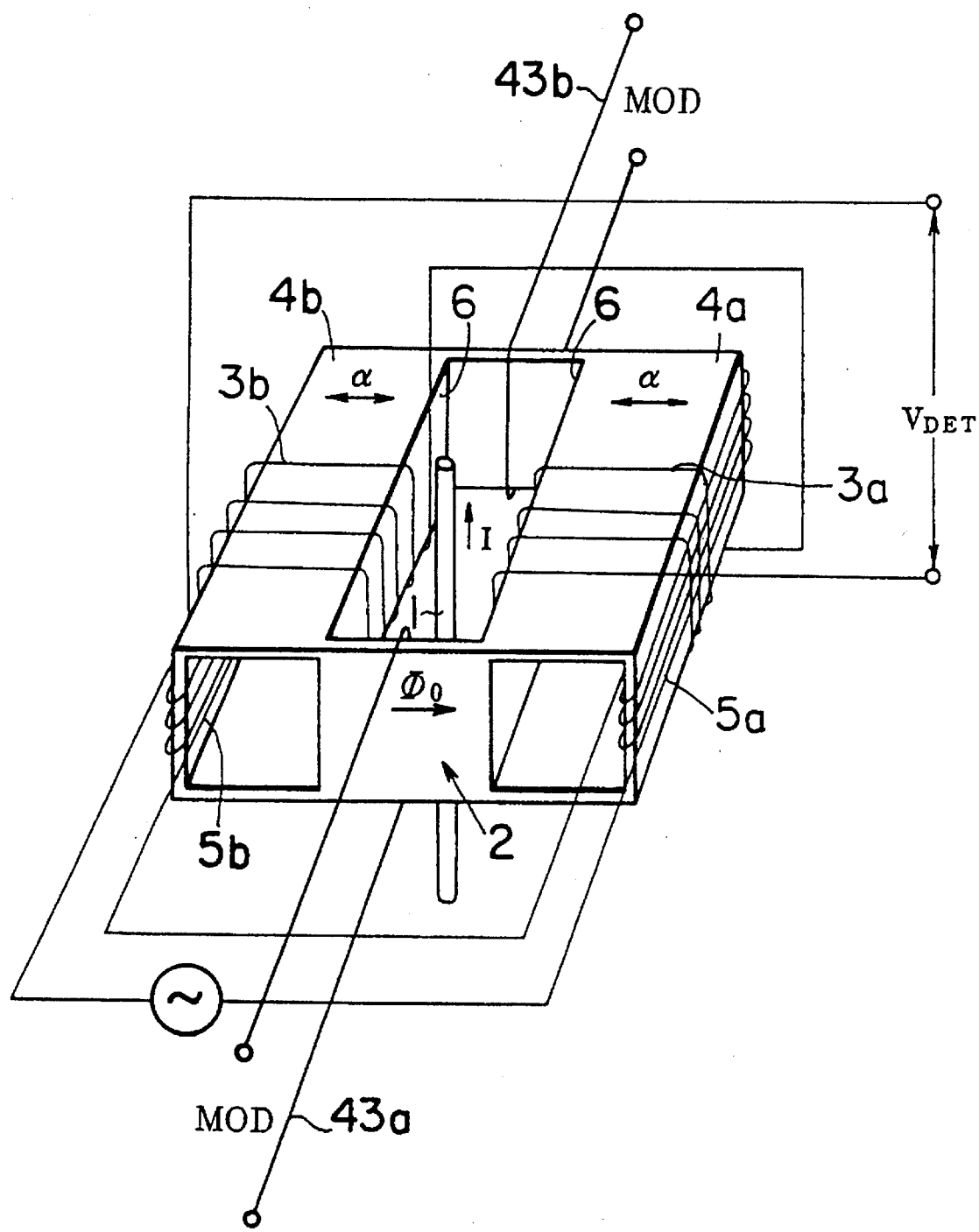
FIG. 14 is a perspective explanatory view showing an outline of a DC current sensor invented before inventing a DC current sensor of the present invention.

For example, a DC current sensor constituted as shown in FIG. 14 includes the aforesaid effects, whereby a stable measurement can be realized.

That is, in the configuration shown in FIG. 11, though the electromagnetic balance as the DC current sensor is difficult to be accomplished, because the exciting core 4 connected to the detecting core 2 is one, and also the detecting coil 3, exciting coil 5 and modulation coil 43 are respectively disposed at one location, the DC current sensor shown in FIG. 14 is constituted by taking into consideration of the electromagnetic balance of the exciting core 4, detecting coil 3, exciting coil 5 and modulation coil 43.

In FIG. 14, numeral 1 designates a lead wire being detected, which extends through the inner center portion of a detecting core 2 having a rectangular frame shape. On long side portions at opposite positions of the rectangular frame-shaped detecting core 2, a pair of exciting cores 4a, 4b are disposed in a body so as to form a quadrangular cylinder. Meanwhile, at side faces of the outermost peripheries of the pair of exciting cores 4a, 4b, exciting coils 5a, 5b are wound in a toroidal shape. A pair of detecting coils 3a, 3b are wound around the pair of exciting cores 4a, 4b in a toroidal shape for electrical connection.

Furthermore, on short side portions at opposite positions of the rectangular frame-shaped detecting core 2, a pair of modulation coils 43a, 43b are disposed to extend through in the same direction as the lead wire being detected 1, and are connected in series electrically by predetermined means.

When a DC current I flows through the lead wire being detected 1 in such a configuration, a magnetic field, which is clockwise to the direction of the DC current I, is produced in the detecting core 2, and a magnetic flux $\Phi_0$ is generated in the detecting core 2.

At this time, when a predetermined AC current is applied to the exciting coils 5a, 5b to produce a magnetic flux, which changes in a direction a periodically in the pair of exciting cores 4a, 4b, which are saturated magnetically, periodically, the core intersection 6 at the long side portion, which is a part of circumferential direction of the rectangular frame-shaped detecting core 2, substantially forms a so-called magnetic gap where a relative permeability μ is extremely close to 1, thereby the magnetic flux $\Phi$ in the detecting core is reduced to $\Phi_1$.

Thus, the above-mentioned DC current sensor also has a same mechanism of producing the electromotive force to the pair of detecting coils 3a, 3b as the configuration shown in FIG. 11, and the effect of the mechanism is obtained similarly. Furthermore, in this configuration, the effect of disposing the pair of modulation coils 43a, 43b, the effect of reducing the residual magnetic flux density in the detecting core 2 resulting from the demagnetizing effect by increasing the ratio of width d of the connection of the exciting core 4, against the magnetic path length of the detecting core 2, and the effect of electromagnetic balance resulting from the overall symmetrical configuration against the lead wire being detected 1 are obtained.

Meanwhile, the inventors have studies a DC current sensor in which the above-mentioned configuration was further improved. Though precise detection is possible in any of the configurations of the DC current sensor described above, since the detecting core 2, through which the lead wire being detected 1 is disposed, is formed into a body, it is very complicated to mount to the wired lead (the lead wire being detected 1).

That is, in the case of mounting to the wired lead, it is necessary to cut off a power source and disconnect the wiring to dispose the lead wire being detected 1 through a through hole of the detecting the core 2, and particularly, in a facility of high public intersects such as a power station, it was impossible to interrupt electricity for disposing a leakage detector including the above-mentioned DC current sensor.

Figure 15:
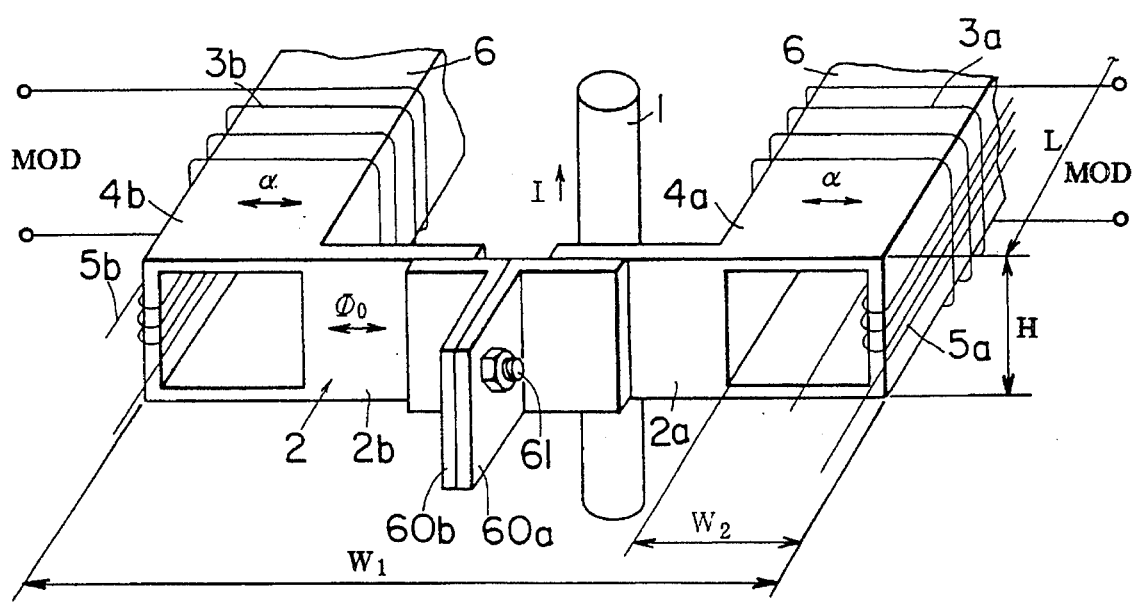
FIG. 15 is a perspective explanatory view showing an outline of a DC current sensor invented before inventing a DC current sensor of the present invention.

A DC current sensor shown in FIG. 15 is constituted to solve such problems whereby it can be mounted to the active lead wire and to the wiring, here the lead wire are difficult to cut and connect.

A basic configuration of the DC current sensor shown in a perspective explanatory view of FIG. 15 is similar to the DC current sensor having the configuration shown in FIG. 14 previously described.

That is, numeral 1 designates a lead wire being detected, which is disposed through an inner center portion of a detecting core 2. In this configuration, however, the detecting core 2 is divided into a pair, and at end portions of detecting core members 2a, 2b, L-shaped mounting members 60a, 60b consisting of the same material as the detecting core members 2a, 2b are secured, and integrated by means of a screw 61, after disposing the lead wire being detected 1 at a predetermined position.

A pair of exciting cores 4a, 4b are disposed in a body on respective opposite long side portions of the detecting core members 2a, 2b as to form a quadrangular cylinder. Meanwhile, around side faces of the utmost periphery of the pair of exciting cores 4a, 4b, exciting coils 5a, 5b are wound in a toroidal shape.

Furthermore, detecting coils 3a, 3b are also wound around the exciting cores 4a, 4b in a toroidal shape. Modulation coils 43a, 43b are wound at the same locations as the detecting coils 3a; 3b.

When a DC current I is applied to the lead wire being detected 1 in such a configuration, by the same mechanism as the configuration shown in FIG. 14, the DC current flowing through the lead wire being detected 1 can be detected by the detecting coils 3a, 3b. Also, substantially the same effect as the DC current sensor constituted as shown in FIG. 14 can be realized.

The inventors have accumulated various improvements as described above, and succeeded in expanding the scope of use of the DC current sensor further, thereby the sensitive DC current sensor which can be mounted to existing equipments and is possible to cope with a microscopic current variation can be provided.

However, in the configuration shown in FIG. 15, taking basically the electromagnetic balance into consideration, from the fact that the detecting coils 3a, 3b, exciting coils 5a, 5b and modulation coils 43a, 43b are wound around the divided detecting core members 2a, 2b independently, when the DC current sensor is mounted to the lead wire being detected 1 in the exciting equipments, the lead wire being detected 1 is surrounded by the detecting core members 2a, 2b so as to dispose the former substantially through the latter without being cut, thereafter, the detecting core members 2a, 2b are integrated, and the detecting coils 3a, 3b, exciting coils 5a, 5b and modulation coils 43a, 43b are connected.

Such connections are, in fact, very complicated, and in the configuration where the connections are completed, there is the possibility of cutting the wires when disposing the lead wire being detected 1, requiring careful handling more than necessary.

In order to solve such problems, for example, in the DC current sensor constituted as shown in FIG. 15, only one detecting coils 3a, 3b, exciting coils 5a, 5b and modulation coils 43a, 43b wound around the divided detecting core members 2a, 2b and exciting cores 4a, 4b may be used.

That is, it may be constituted such that, the exciting core 4b, detecting coil 3b, exciting coil 5b and modulation coil 43b are not disposed on one detecting core member 2b, but the exciting core 4a, detecting coil 3b, exciting coil 5a and modulation coil 43 are disposed only on another detecting core member 2a, thereby a predetermined electromotive force can be outputted to the detecting coil 3a, by the same mechanism as described before, by exciting the exciting coil 5a.

However, the DC current sensor shown in FIG. 15 is that, the respective cores and coils are disposed by considering the electromagnetic balance originally, thus the above-mentioned coil arrangement may break the electromagnetic balance, besides, an exciting signal by the exciting coil 5a is mixed largely into the detecting coil 3a to make the precise detection impossible.

Particularly, a second high frequency of the exciting signal caused by non-linearity of the magnetic characteristic originally included in the soft magnetic material constituting the detecting core 2a and the exciting core 4a is mixed into the detecting coil 3a, besides, since the second high frequency and a detecting signal (an electromotive force of the detecting coil 3a) have the same frequency, it is impossible to separate them electrically.

Thus, in the above-mentioned configuration, it was difficult to provide the DC current sensor having a high S/N ratio, which is easy to handle and versatile.

The DC current sensor of the present invention has been developed by, as it is apparent from the details of various improvements described heretofore, adopting the configuration shown in FIG. 11 as the basic configuration, and developing the configuration considering the electromagnetic balance as shown in FIG. 14, and developing the configuration which can be mounted to the existing lead wire being detected without cutting the same as shown in FIG. 15 to widen the versatility of the DC current sensor constituted as shown in FIG. 14, and further, improving disadvantages of the configuration shown in FIG. 15 for solving the aforementioned problems, whereby the detecting core is constituted by a plurality of detecting core members so as to be divided, at least, at one portion when disposing the lead wire being detected therethrough, and the exciting core, exciting coil and detecting coil are disposed effectively on one of the detecting core members. The specific configuration is particularly described by the embodiments shown hereinbelow.

Figure 1:
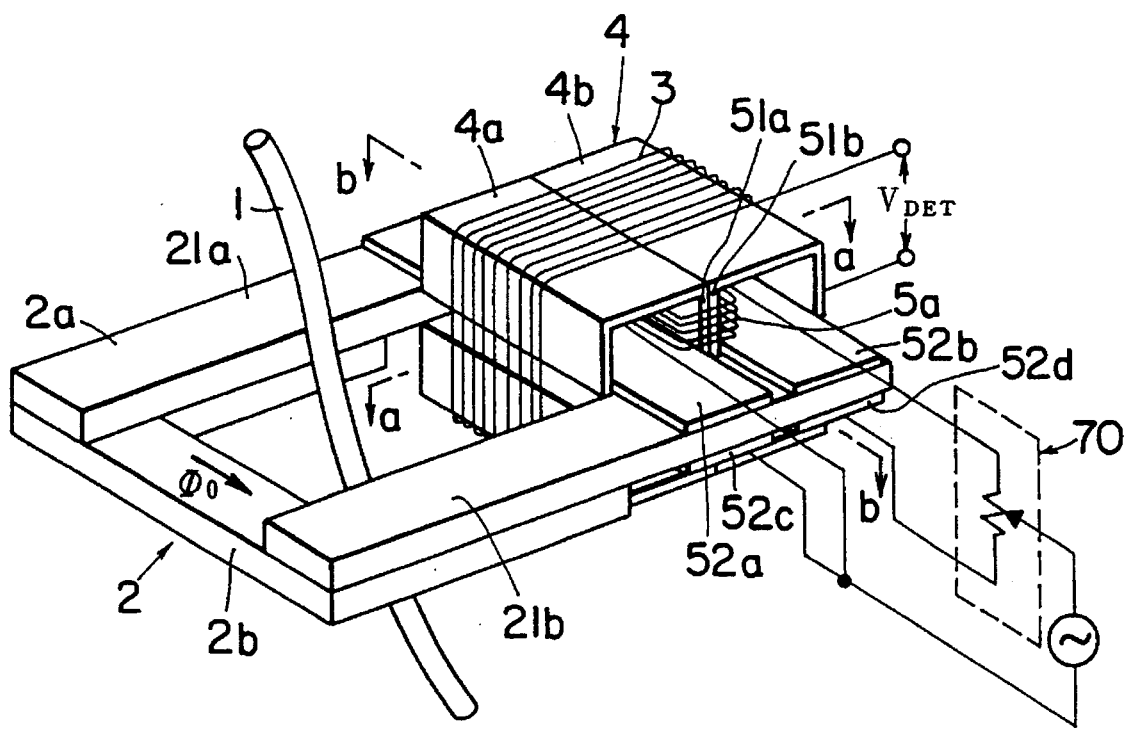
FIG. 1 is a perspective explanatory view showing an outline of one embodiment of a DC current sensor of the present invention.
Figure 2:
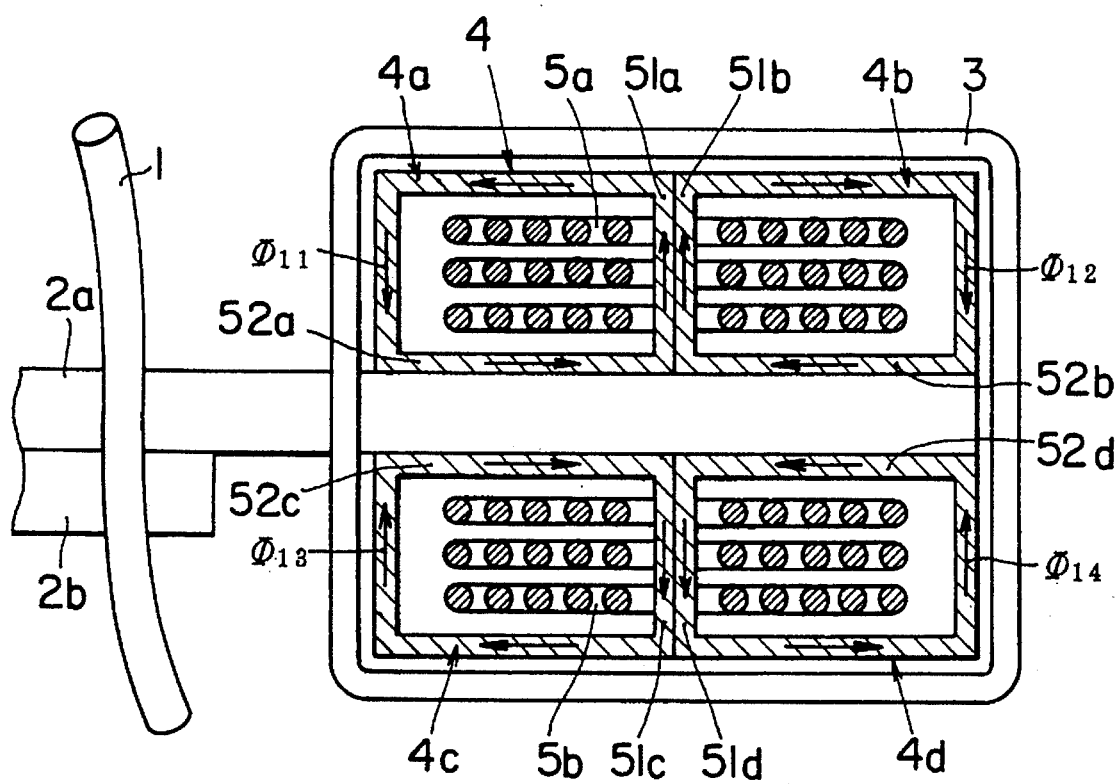
FIG. 2 is a longitudinal sectional explanatory view taken along a line a—a of the DC current sensor shown in FIG. 1.
Figure 3:
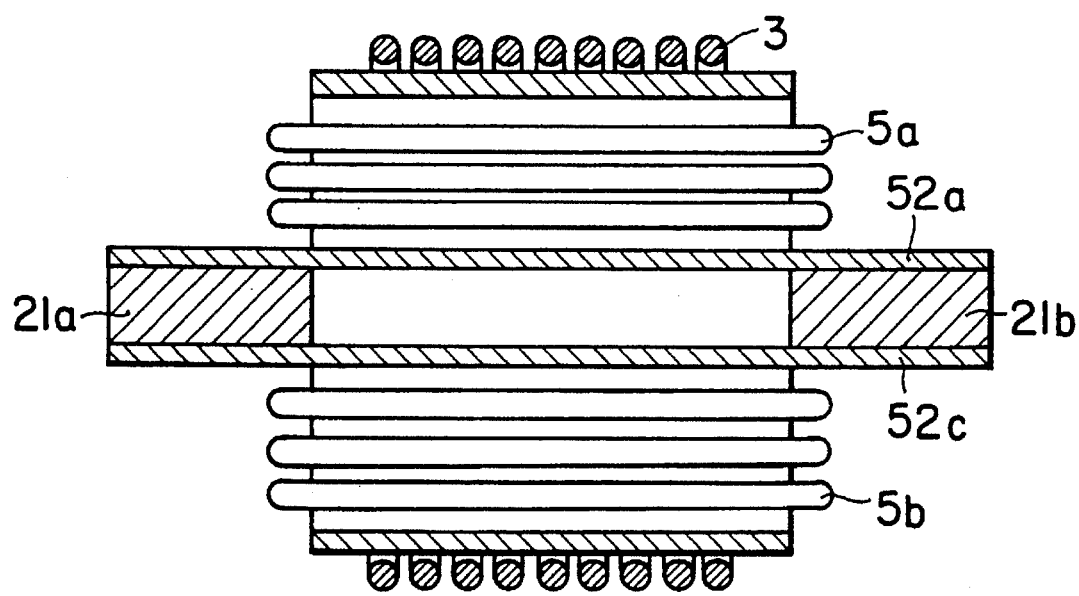
FIG. 3 is a longitudinal sectional explanatory view taken along a line b—b of the DC current sensor shown in FIG. 1.

FIG. 1 is a perspective explanatory view showing one embodiment of a DC current sensor of the present invention, FIG. 2 is a longitudinal sectional view taken along a line a—a of FIG. 1, and FIG. 3 is a longitudinal sectional view taken along a line b—b of FIG. 1.

In the figure, numeral 1 designates a lead wire being detected, which is disposed inside a detecting core 2 constituting a rectangular frame as a whole. The detecting core 2 is constituted by a detecting core member 2a, which is formed by connecting I-Shaped detecting core members 21a, 21b by a portion of an exciting core 4 to be described later in a body, and a U-shaped detecting core member 2b which is formed in a body beforehand.

The exciting core 4 is constituted by 4 substantially rectangular cylindrical exciting core members 4a, 4b, 4c, 4d, which are oppositely disposed via the I-shaped detecting core members 21a, 21b, and opposite portions 52a, 52b, 52c, 52d of the exciting core members 4a, 4b, 4c, 4d facing the detecting core members 21a, 21b are formed in a body by connecting the detecting core members 21a, 21b, and constitute a portion of the detecting core member 2a.

That is, the opposite portions 52a, 52b, 52c, 52d of the exciting core members 4a, 4b, 4c, 4d facing the detecting core members 21a, 21b form a core intersection of the exciting core, which is connected substantially orthogonally to the circumferential direction of the detecting core member.

In the figure, numerals 5a, 5b designate a pair of exciting coils, which are wound around adjoining portions 51a, 51b and 51c, 51d of the exciting core members 4a, 4b, 4c, 4d. Meanwhile, the pair of exciting coils 5a, 5b are connected for negative-phase exciting of the respective exciting coils 5a, 5b. Numeral 3 designates a detecting coil, which is wound in a body around the exciting core members 4a, 4b, 4c, 4d in a toroidal shape.

When the pair of exciting coils 5a, 5b are subjected to negative-phase excitation in such a configuration, magnetic fluxes $\Phi_{11}$, $\Phi_{12}$, $\Phi_{13}$, $\Phi_{14}$ produced in the exciting core members 4a, 4b, 4c, 4d by the exciting coils 5a, 5b direct as shown in FIG. 2. Hereupon, when a DC current I is applied to the lead wire being detected 1, a magnetic flux $\Phi_0$ is produced in a circumferential direction of the detecting core 2 constituted by the pair of detecting core members 2a, 2b, and also in the opposite portions (core intersections of the exciting cores) 52a, 52b, 52c, 52d of the exciting core members 4a, 4b, 4c, 4d facing the detecting core members 21a, 21b described previously, the magnetic flux $\Phi$ is produced in the same direction (circumferential direction).

The magnetic fluxes $\Phi_{11}$, $\Phi_{12}$, $\Phi_{13}$, $\Phi_{14}$ produced by the negative-phase excitation of the pair of exciting coils 5a, 5b are, substantially, in the perpendicular direction against the magnetic flux $\Phi_0$ in the circumferential direction produced by the DC current flowing through the lead wire being detected 1, at the opposite portions 52a, 52b, 52c, 52d of the exciting core members 4a, 4b, 4c, 4d facing the detecting core members 21a, 21b, thereby a magnetic path by the magnetic flux in the circumferential direction is interrupted by, the portions periodically, and a required output can be obtained in the detecting coil 3 by the same electromagnetic force producing mechanism as the DC Current sensor constituted as shown in FIG. 11, FIG. 14 and FIG. 15 previously described.

However since the pair of exciting coils 5a, 5b are subjected to negative-phase excitation in this configuration, the magnetic fluxes $\Phi_{11}$ and $\Phi_{13}$, $\Phi_{12}$ and $\Phi_{14}$ produced in the exciting core members 4a and 4c, 4b and 4d which are disposed oppositely via the detecting core members 21a, 21b, are in the opposite direction with each other against the winding direction of the detecting coil 3, and as same as a leakage magnetic flux produced by excitation of the exciting coils 5a, 5b, the second high frequency of an exciting signal is also substantially negated, as a result, an exciting signal can be prevented from mixing into the detecting coil 3.

Particularly, by adopting the configuration, in which a balance volume 70 (refer to FIG. 1) is disposed between the pair of exciting coils 5a, 5b to balance the exciting current applied to the exciting coils 5a, 5b in such a manner that, the maximum negating effect of the magnetic fluxes $\Phi_{11}$ and $\Phi_{13}$, $\Phi_{12}$ and $\Phi_{14}$ (refer to FIG. 2) can be obtained, or a residual output from the detecting coil 3 becomes minimum, the S/N ratio can be improved further.

Figure 4:
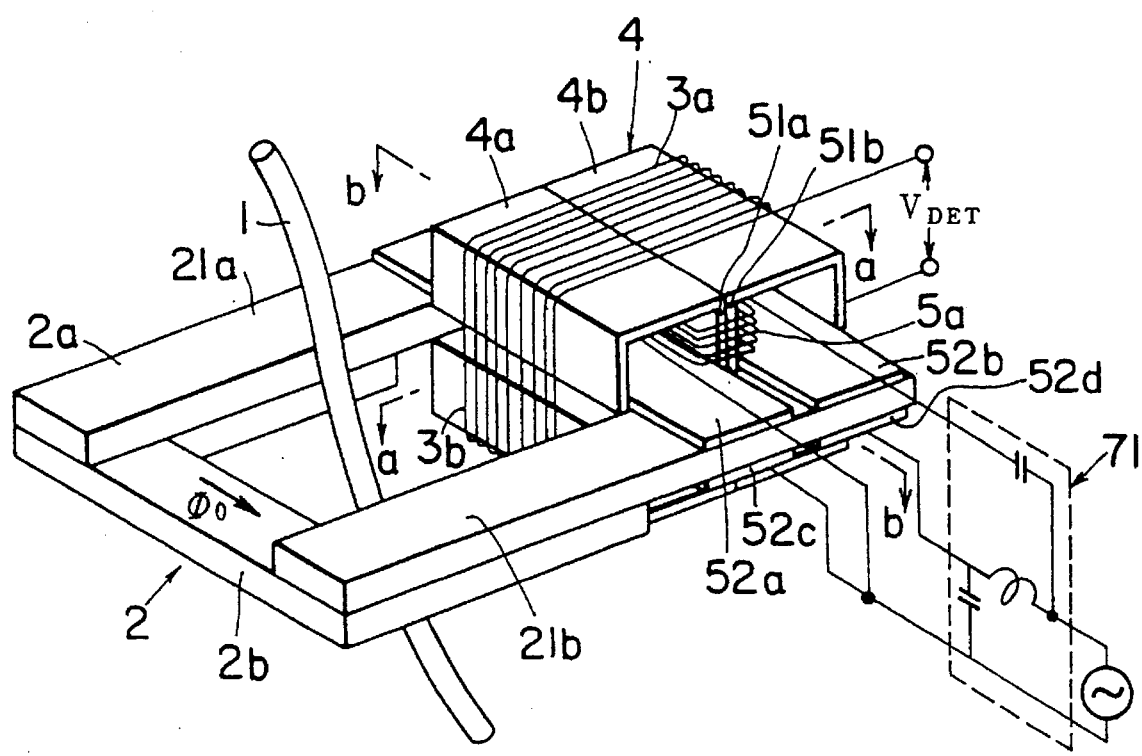
FIG. 4 is a perspective explanatory view showing an outline of another embodiment of a DC current sensor of the present invention.
Figure 5:
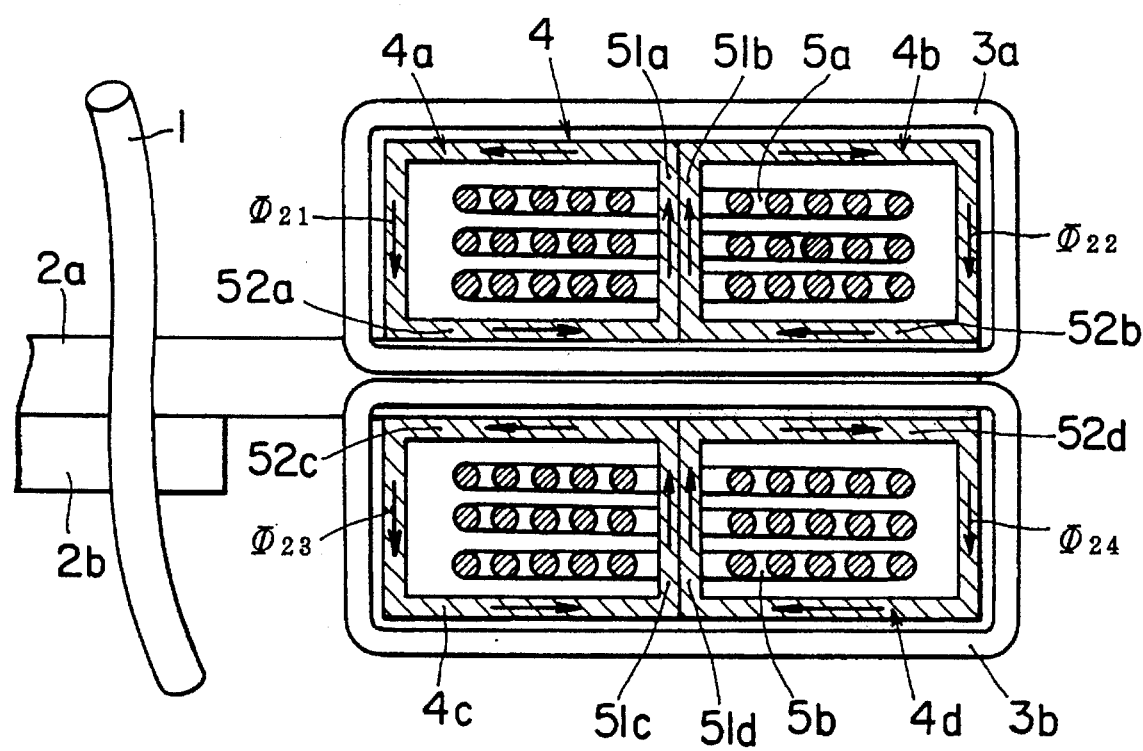
FIG. 5 is a longitudinal sectional explanatory view taken along a line a—a of the DC current sensor shown in FIG. 4.
Figure 6:
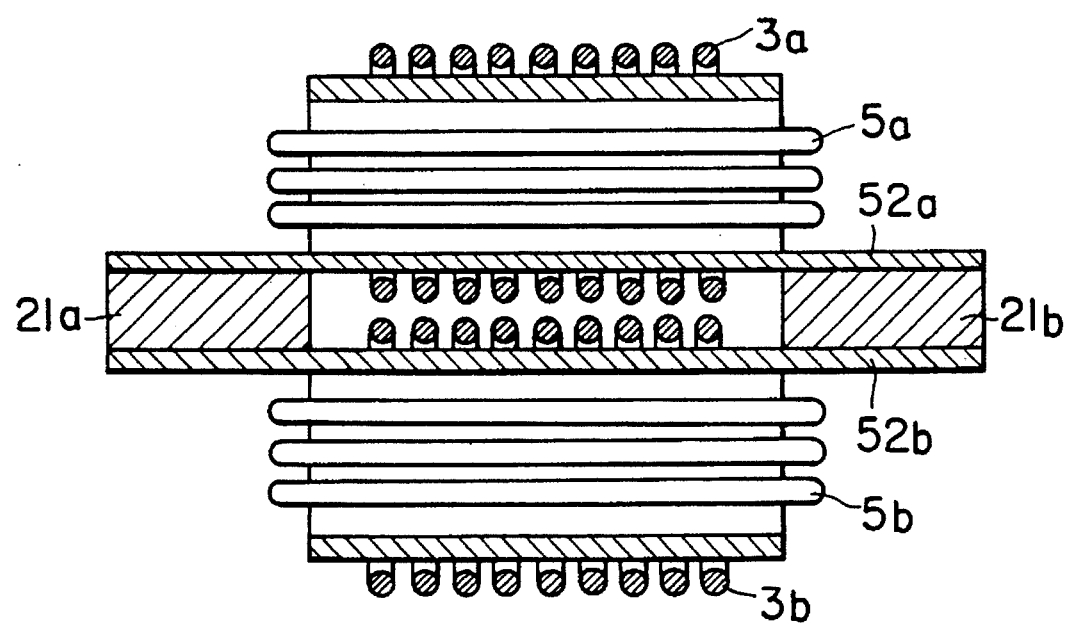
FIG. 6 is a longitudinal sectional explanatory view taken along a line b—b of the DC current sensor shown in FIG. 4.

FIG. 4 is a perspective explanatory view showing another embodiment of a DC current sensor of the present invention, FIG. 5 is a longitudinal sectional view taken along a line a—a of FIG. 4, and FIG. 6 is a longitudinal sectional view taken along a line b—b of FIG. 4.

Also in this DC current sensor, the configuration of the detecting core 2 and the exciting core 4 is substantially similar to that of the DC current sensor shown in FIG. 1.

That is, in the figure, numeral 1 designates a lead wire being detected, which is disposed inside the detecting core 2 constituted substantially in a rectangular frame. The detecting core 2 is constituted by a detecting core members 2a, which is formed by connecting I-shaped detecting core members 21a, 21b by a portion of the detecting core 4 to be described later in a body, and a U-shaped detecting core member 2b which is formed in a body beforehand.

The exciting core 4 is constituted by 4 substantially rectangular cylindrical exciting core members 4a, 4b, 4c, 4d, which are oppositely disposed via the I-shaped detecting core members 21a, 21b, and opposite portions 52a, 52b, 52c, 52d of the exciting core members 4a, 4b, 4c, 4d facing the detecting core members 21a, 21b are formed in a body by connecting the detecting core members 21a, 21b to constitute a portion of the detecting core member 2a.

That is, the opposite portions 52a, 52b, 52c, 52d of the exciting core members 4a, 4b, 4c, 4d facing the detecting core members 21a, 21b form a core intersection of the exciting core, which is connected substantially orthogonal to the circumferential direction of the detecting core member.

In the figure, numerals 5a, 5b designate a pair of exciting coils which are wound around adjoining portions 51a, 51b and 51c, 51d of the exciting core members 4a, 4b, 4c, 4d. The pair of exciting coils 5a, 5b are so connected that, exciting currents whose relative phase difference is 90° (phase difference of 90° or 270°) can be applied, for example, they are connected to a power source via a 90° phase circuit as shown at numeral 71 (refer to FIG. 4).

In the figure, numerals 3a, 3b designate detecting coils, which are wound in a toroidal shape around the exciting core members 4a, 4b, around which the exciting coil 5a is wound, and the exciting core members 4c, 4d, around which the exciting coil 5b is wound. The pair of detecting coils 3a, 3b are connected in series in a negative phase.

When the exciting current having the relative phase difference of 90° is applied to the pair of exciting coils 5a, 5b in such a configuration, as shown in FIG. 5, magnetic fluxes $\Phi_{21}$, $\Phi_{22}$ and $\Phi_{23}$, $\Phi_{24}$ are produced in the exciting core members 4a, 4b and 4c, 4d based on the phase difference of the exciting current. However, though the magnetic flues are produced in the same direction in the exciting core members 4a and 4c, 4b and 4d, due to the phase difference of the exciting current, when the exciting core members 4a, 4b excited, the exciting core members 4c, 4d are not excited.

Hereupon, when the DC current I is applied to the lead wire being detected 1, a magnetic flux $\Phi_0$ is produced in a circumferential direction of the detecting core 2 constituted by the pair of detecting core members 2a, 2b, and also at opposite portions (core intersection of the exciting core) 52a, 52b, 52c, 52d of the exciting core members 4a, 4b, 4c, 4d facing the detecting core members 21a, 21b previously described, the magnetic flux $\Phi$ is produced in the same direction (circumferential direction).

Also, the magnetic fluxes $\Phi_{21}$, $\Phi_{22}$, $\Phi_{23}$, $\Phi_{24}$ produced by applying the exciting current, whose relative phase difference is 90°, to the pair of exciting coils 5a, 5b, are substantially in the perpendicular direction against the magnetic flux $\Phi_0$ produced in the circumferential direction by the DC current flowing through the lead wire being detected 1, in the opposite portions 52a, 52b, 52c, 52d of the exciting core members 4a, 4b, 4c, 4d facing the detecting core members 21a, 21b, thus a magnetic path by the magnetic flux in the circumferential direction is interrupted periodically by the portions.

However, as described above, due to the phase difference of the exciting current, at the opposite portions 52a, 52b, 52c, 52d of the exciting core members 4a, 4b, 4c, 4d facing the detecting core members 21a, 21b, while the magnetic path by the magnetic flux in the circumferential direction is interrupted by the opposite portions 52a, 52b, the opposite portions 52c, 5d are connected without interrupting the magnetic path.

Figure 7:
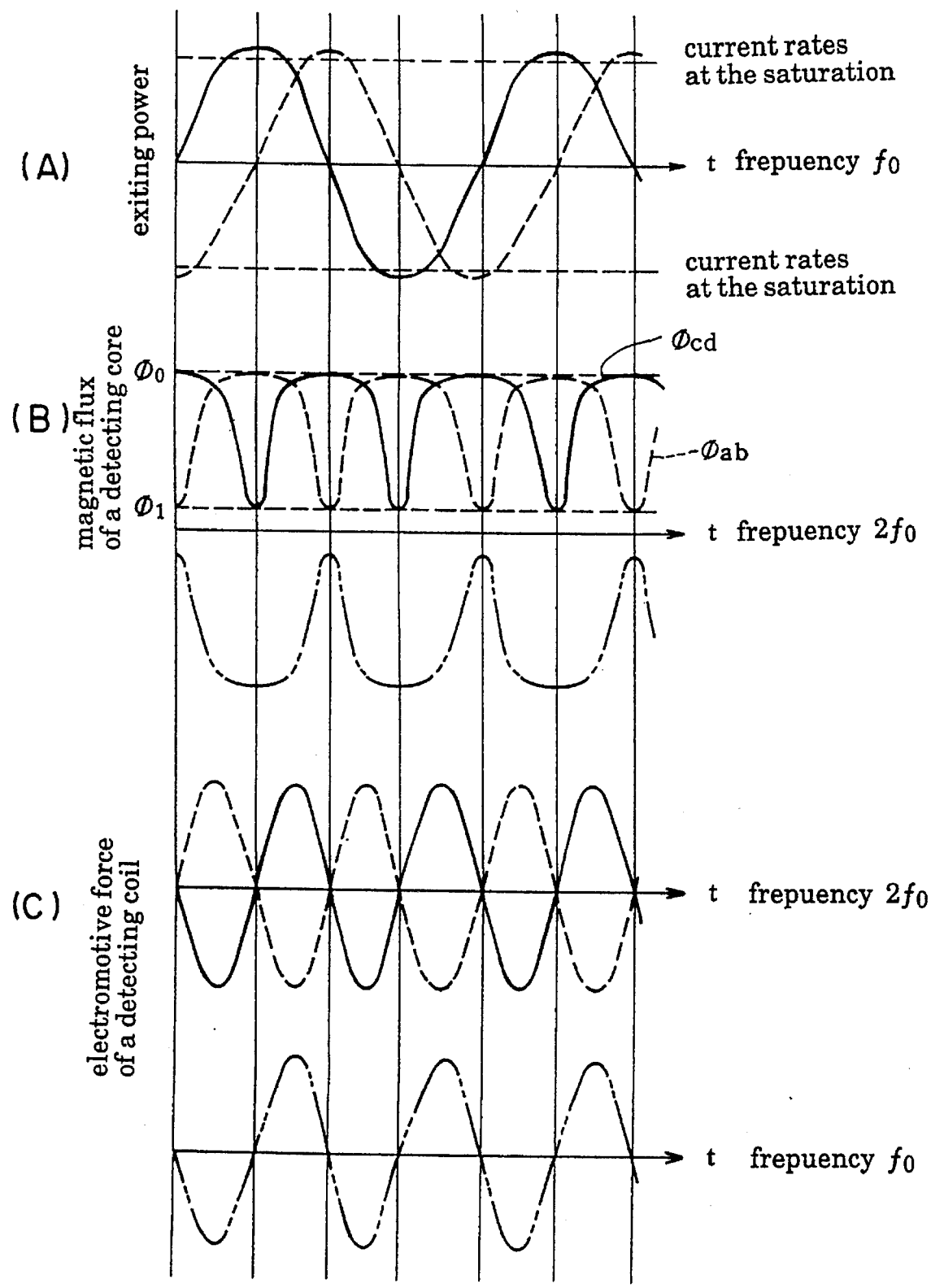
FIG. 7 is a graphs showing the relationship between an exciting current, a magnetic flux passing a detecting core and an electromotive force of a detecting coil in a DC current sensor configuration shown in FIG. 4.

Describing further in detail, for example, when the exciting current shown by a solid line in FIG. 7(a) is applied to the exciting coil 5a, in a state where the magnetic flux $\Phi_0$ is produced in the circumferential direction in the detecting core 2, the magnetic flux $\Phi_0$ reduces periodically to $\Phi_1$ as shown by a solid line in FIG. 7(B), by the magnetic fluxes $\Phi_{21}$, $\Phi_{22}$ produced at the opposite portions 52a, 52b of the exciting core members 4a, 4b facing the detecting core members 21a, 21b.

Likewise, as shown by broken lines in FIG. 7(A), when the exciting current, whose phase difference is 90° relative to the exciting current applied to the exciting coil 5a, is applied to the exciting coil 5b, the magnetic flux $\Phi_0$ reduces periodically to $\Phi_1$ as shown by broken lines in FIG. 7(B), by the magnetic fluxes $\Phi_{23}$, $\Phi_{24}$ produced at the opposite portions 52c, 52d of the exciting core members 4c, 4d facing the detecting core members 21a, 21b.

That is, in the detecting coils 3a and 3b, responsive to the magnetic flux variations shown by the solid and broken lines in FIG. 7(B), by the same electromotive force producing mechanism as the DC current sensor constituted as shown in FIG. 11, FIG. 14 and FIG. 15 described previously, predetermined outputs as shown by the solid and broken lines in FIG. 7(C) are obtained. However, when the pair of detecting coils 3a, 3b are connected in a positive phase, as it is apparent from FIG. 7(C), the electromotive forces of the detecting coils 3a, 3b negate one another, and the required output characteristic can not, substantially, be obtained.

However, when the detecting coils 3a and 3b are connected in series in a negative phase, an electromotive force as shown by a two-dot chain line in FIG. 7(C) responsive to the magnetic flux variation as shown by a two-dot chain line in FIG. 7(B) is substantially produced in the detecting coil 3b, as a result, a sum of the electromotive forces of the detecting coils 3a, 3b is outputted.

Besides, since the detecting coils 3a, 3b are connected in a negative phase, even when foreign noises are mixed thereinto, the noises are canceled one another and only the electromotive force produced by the DC current flowing through the lead wire being detected 1 can be outputted accurately (precisely).

Furthermore, in the DC current sensor constituted as such, since the relative phase difference of the exciting current applied to the exciting coils 5a, 5b is 90°, and the magnetic flux $\Phi_0$ in the circumferential direction produced in the detecting core 2 by the DC current flowing through the lead wire being detected 1 substantially maintains, as previously described, a constant value without being interrupted as viewing from the detecting core 2 as a whole (even when interrupted partly, it is connected through the other portion), a fall of output due to deterioration of the alternating magnetic characteristic of the detecting core 2 material can be prevented.

That is, when a magnetic flux produced in a longitudinal direction of the opposite portions 52a, 52b is $\Phi_{ab}$, and a magnetic flux produced in the longitudinal direction of the opposite portions 52c, 52d is $\Phi_{cd}$, $\Phi_0 = \Phi_{ab} + \Phi_{cd}$, and $\Phi_{ab} + \Phi_{cd} \doteq \Phi_0$ from FIG. 7(B), which is constant, thus the magnetic flux produced in the pair of detecting core materials 2a, 2b does not change and substantially maintains a constant value proportional to I. Thus, the detecting core members 2a, 2b are just required to be made of a material having a good DC magnetic characteristic, and the alternating magnetic characteristic may be neglected, and hence, for example, a parmalloy block material which is advantageous in strength can be used.

Since the DC current sensor constituted as shown in FIG. 1 and FIG. 14 is that, the detecting coil 3, exciting core 4 and exciting coil 5 are disposed in a body only on one of the pair of detecting core members 2a, 2b which can be divided, it is not necessary to connect to the other detecting core members, thus it is easy to mount to the existing lead wire being detected, thereby the possibility of breaking wires at installation is considerably reduced and the DC current sensor can be mounted reliably.

Figure 8:
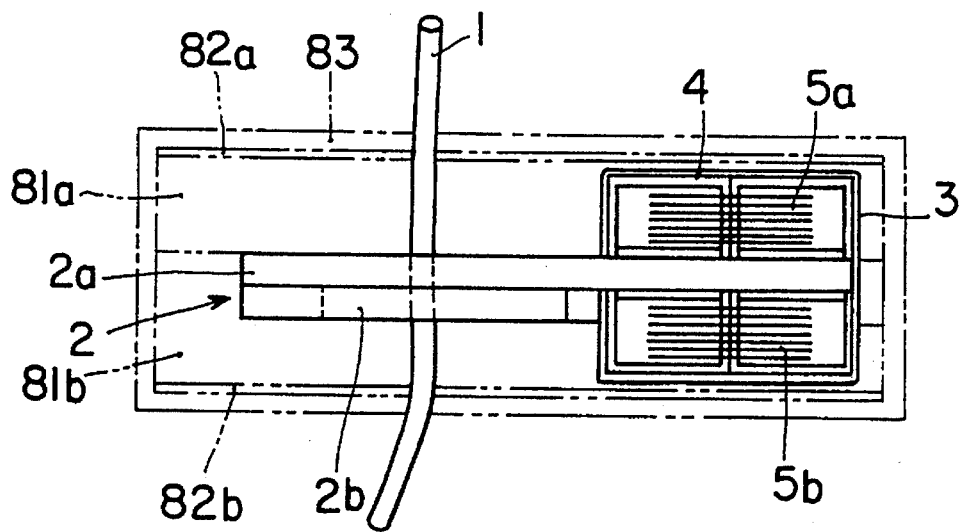
FIG. 8 is a schematic explanatory view showing a mode at the time of using the DC current sensors shown in FIG. 1 and FIG. 4.

FIG. 8 is a schematic explanatory view sowing a configuration of detecting core members 2a, 2b used in such a manner that, the DC current sensor constituted as shown in FIG. 1 and FIG. 4 can be handled easier.

In the figure, numeral 81a designates a support members for supporting and securing the detecting core member 2a, and 81b designates a support member for supporting and securing the detecting core member 2b, which are both constituted by a bakelite plate or a synthetic resin plate having an electrical insulation and consisting of a non-magnetic material. Meanwhile, glass epoxy plates 82a, 82b are bonded to the outer faces of the support members 81a, 81b to improve the mechanical strength thereof, and to secure the electrical insulation between the detecting core 2, detecting coil 3, exciting core 4, exciting coil 5 and the outside. Furthermore, these components are entirely covered with a shield case 83 consisting of a or anisotropic silicon steel plate and the like to prevent induced noises from mixing in. In practical use, in order to avoid improper electrical connection at butt faces of the detecting core members 2a, 2b, for example, the butt faces are polished to secure a high flatness, and in order to maintain a good connection, it is desirable to dispose various known fixing means on the support members 81a, 81b.

The DC current sensor of the present invention is that, various configurations can be adopted within the claimed scope without being limited to the configurations shown in FIG. 1 and FIG. 4 previously described.

For example, though the modulation coil 43 which is disposed in the configurations in FIG. 11, FIG. 14 and FIG. 15 is not shown in the configurations shown in FIG. 1 and FIG. 4, the same effect can be obtained by disposing the modulation coil 43 in the configurations shown in FIG. 1 and FIG. 4. Also, by adopting the configuration in which the modulation coil 43 and the detecting coil 3 are used commonly in a body, the output characteristic hysteresis can be reduced.

Since an absolute value is well as a direction of the DC current flowing through the lead wire being detected can be detected easily, means for applying the exciting current in a state, where the frequency of the exciting current oscillated from an oscillator, beforehand, at the frequency of two times the exciting current is divided into half, to the exciting coil 5 to detect the phase difference of the oscillator output and the detecting coil output by a phase comparing circuit, or means for applying the electric current whose direction and intensity change linearly periodically against the time, for example, change in a triangular waveform to the detecting coil 3, to give a modulation magnetic field in the detecting core may be adopted. Furthermore, by combining various known electric circuits effectively, essential advantages of the DC current sensor of the present invention can be used more effectively.

In the DC current sensor of the present invention, as the annular soft magnetic material constituting the detecting core and the exciting core, the soft magnetic materials are desirably selected, responsive to the intensity of electric current flowing through the lead wire being detected, or the detecting sensitivity required for the sensor. Usually, though the is preferable when considering the magnetic characteristic and workability, other known soft magnetic materials such as a silicon steel plate, amorphous, electromagnetic soft iron and soft ferrite may be used independently or in combination.

The annular soft magnetic material is not limited to the so-called ring-shaped soft magnetic material, it may just be constituted to form an electromagnetically closed circuit, and besides the rectangular frame-shaped detecting core and the rectangular cylindrical exiting core as shown in the figure, various configurations such as the circular or oval ring-shaped detecting core may also be adopted.

Particularly, as to the detecting core, since it is constituted by a plurality of detecting core members so as to be divided, at least, at one portion in the circumferential direction when disposing the lead wire being detected therethrough, it is desirable to devise the configuration of the detecting core member, which is, finally, easy to assemble in a body. As the aforesaid embodiment, it is also possible to use a portion of the exciting core as a member constituting the detecting core member. When considering the final assembling for integration, it is desirable that the detecting core is divided as few as possible and the detecting core members are reduced as much as possible.

Figure 10:
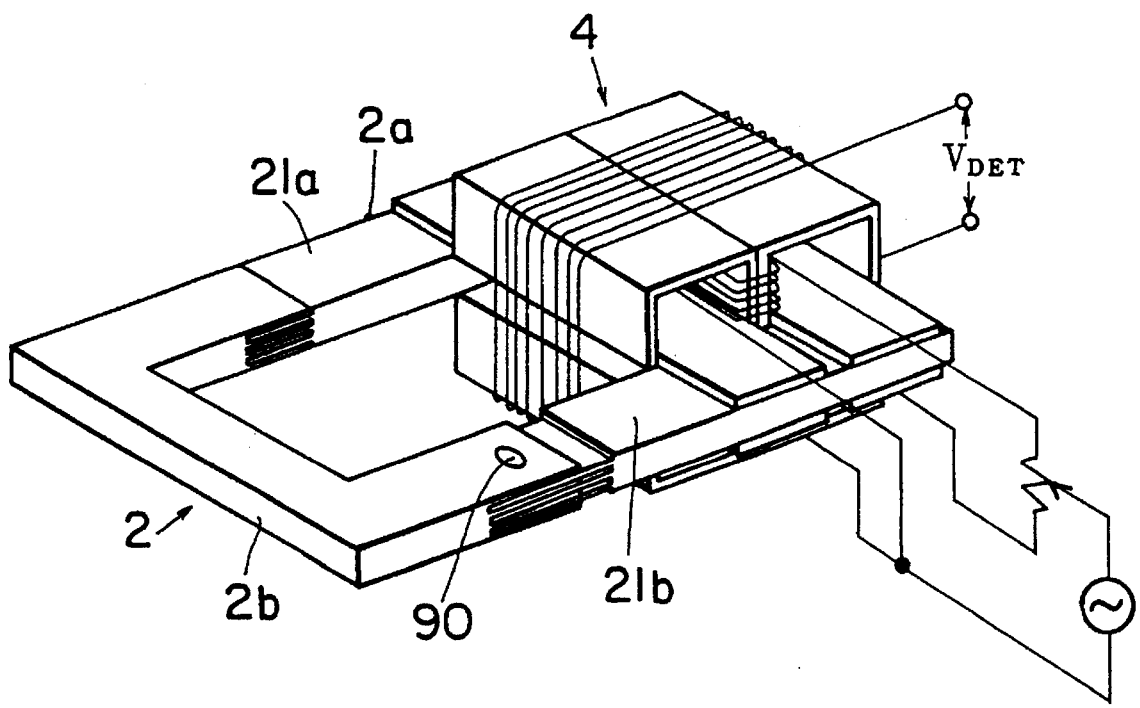
FIG. 10 is a perspective explanatory view showing a mode in the case of using the DC current sensor shown in FIG. 1 as a clamp meter.

It is also possible to use as a clamp meter by adopting the configuration as shown in FIG. 10. FIG. 10 shows the configuration in which the detecting core materials 2a, 2b of FIG. 1 are improved. That is, depressions and protrusions are respectively formed at opposite portions of end portions of the I-shaped detecting core members 21a, 21b constituting the detecting core member 2a, which is connected in a body with the exciting core 4, and end portions of the U-shaped detecting core member 2b which is formed into a body beforehand, for engagement. Furthermore, one of the engaged portions (the side of detecting core :member 21b) is held by a screw 90 so that the other engaged portion (the side of detecting core member 21a) is open and closed about the screw 90.

Though the above-mentioned depressions and protrusions may be formed by machining the opposite portions of the detecting core members 21a, 21b and 2b made of a thick plate, they may be formed more easily by constituting the detecting core members 21a, 21b and 2b proper by laminating thin plates having different lengths. The opposite portions of the detecting core members 21a, 21b, 2b are necessarily, are not limited to the configuration of depressions and protrusions, the configuration, in which the respective faces are finished precisely to butt the fiat faces one another, may be selected responsive to the required measurement accuracy.

The configuration described above can be similarly adopted in the DC current sensor constituted as shown in FIG. 4.

Though the exciting core is constituted such that, in the embodiment, the two rectangular cylindrical exciting core members are adjoined in a body, and disposed oppositely via the detecting core member to form a pair of exciting cores, it is desirable to select a form responsive to the location where the exciting coil is disposed, for example, it is possible to dispose each rectangular cylindrical exciting core member via the detecting core member, or to dispose 4 rectangular cylindrical exciting core members. Similarly, the exciting coil may also be wound responsive to the disposing form of the exciting core, for example, even when it is constituted to wound a plurality of exciting coils around a pair of exciting cores, it is possible to connect electrically so as to constitute the pair of exciting coils, whereby the operation effect as previously described can be obtained as a whole.

In the DC current sensor of the present invention, with respect to the magnetic saturation at core intersections between the detecting core and the exciting core, for example, even when the core intersections are not completely saturated, as far as the saturated state can be substantially obtained, the required detection can be accomplished.

Thus, by selecting optimum conditions including, the aforesaid soft magnetic material, its shape and size and turns of the detecting coil and exciting coil, a sensor which can be used more practically can be provided.

Meanwhile, in either of the aforementioned configurations, the leadwire being detected disposed through the detecting core is not limited to one, a plurality of lead wires being detected may also be disposed responsive to the size of the required sensor. For example, when two lead wires being detected are disposed and the direction of t electric current flowing through the two lead wires being detected is different, it is possible to output only a difference of electric current value flowing through the two conductors, thus the effect of the DC current sensor of the present invention can be realized most effectively when used in leakage detection of the DC equipments.

EXAMPLE

Example 1

Four pieces of rectangular cylindrical exciting core members 4a, 4b, 4c, 4d were prepared, by punching a thin plate of 0.35 mm thick composed of permalloy C (78% Ni-5% Mo-4% Cu-balFe) into predetermined shapes, which were bent at predetermined locations and assembled for spot welding. A pair of I-shaped detecting core members 21a and a U-shaped detecting core member 2b were also punched from a thin plate of 1.5 mm thick having the same composition as the exciting core member. Then, the four exciting core members 4a, 4b, 4c, 4d were spot welded together with the pair of I-shaped detecting core members in a body, and further, these component members and the U-shaped detecting core member 2b were heated in a hydrogen gas atmosphere at 1100° C. for 3 hours, thereafter the heat treatment was performed through multi-stage cold treatment between 400° C. and 600° C. at 100° C./hr.

A core assembly shown in FIG. 1 was obtained in the above-mentioned manner. Where, approximate length L=26 mm, height H=7.5 mm and width W=27 min.

After winding an insulation protective vinyl tape around adjoining portions of the rectangular cylindrical exciting core members, a formal wire of 0.3 mm outside diameter was wound by 1 turns to obtain exciting coils 5a, 5b, which were connected for negative-phase excitation.

Also, after winding the insulation protective vinyl tape around the exciting core members, the formal wire of 0.1 mm outside diameter was wound by 300 turns to obtaining a detecting coil 3. The detecting coil 3 was combined with a predetermined filter circuit to use a modulation coil commonly.

In such a manner, the DC current sensor of the present invention shown in FIG. 1 was completed.

Meanwhile, the detecting core members 2a, 2b constituting the DC current sensor were disposed and connected in a body around a lead wire being detected 1 of 8 mm outside diameter consisting of a vinyl coating, and finally, the lead wire being detected 1 was disposed through the detecting core 2.

Figure 9:
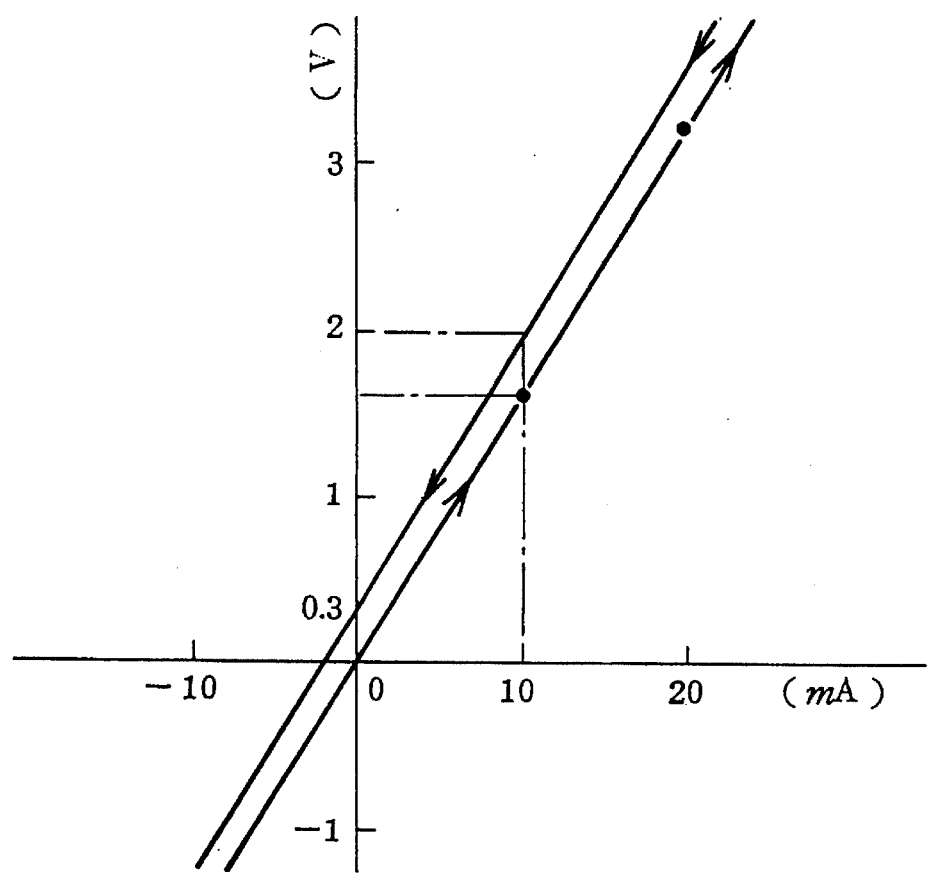
FIG. 9 is a linear graph showing the relationship between a DC current (a micro region) flowing through a lead wire being detected (1) and an output in the DC current sensor shown in FIG. 1.

FIG. 9 shows the output variations after removing an AC component of 11 Hz, by a low-pass filter, in an electromotive force (output) V out of the detecting coil 3 outputted via a phase comparing circuit, when disposing AC current applying means, in which an oscillator producing an exciting current having the frequency two times the exciting current applied finally to an exciting coil 5 is disposed, the phase comparing circuit and the like on the exciting coils 5a, 5b and detecting coil 3 as the DC current sensor of the present invention, applying the AC current of f=3.5 kHz and 0.1 Arms as the exciting current to the exciting coils 5a, 5b for negative-phase excitation, applying a sine wave AC current of 11 Hz and 1 mA (at peak) to allow the detecting coil to function as the modulation coil from the oscillator, and further applying a DC current I to the lead wire being detected 1 in a range of ±100 mA. The output voltage Vout is a value outputted via an amplifying circuit having an amplifying effect, and for the purpose of understanding the effect of the present invention clearly, the output is enlarged in the vicinity where the DC current I of the lead wire being detected 1 is ±10 mA.

As it is apparent from the above measurement result, according to the DC current sensor of the present invention, even when the detecting core can be divided, an error output due to a reciprocating current is very small, and even by a microscopic current of 10 mA, the measurement can be effected at the S/N ratio of 10 times or more and the sensitive measurement is possible.

Example 2

The core assembly of the embodiment 1 was used. After winding an insulation protective vinyl tape around the adjoining portions of the rectangular cylindrical exciting core members, a formal wire of 0.3 mm outside diameter was wound by 15 turns to obtain the exciting cores 5a, 5b, which were connected to a power source via a predetermined phase circuit so as an exciting current having the phase difference of 90° is applied to the exciting coils 5a, 5b.

After winding the insulation protective vinyl tape around the exciting core members disposed oppositely via the detecting core members 21a, 21b, a formal wire of 0.1 mm outside diameter was wound by 150 turns to obtain the detecting coils 3a, 3b, which were connected in series in a negative phase. The detecting coils 3a, 3b were combined with a predetermined filter circuit to use a modulation coil commonly.

In such a manner, the DC current sensor of the present invention shown in FIG. 4 was completed.

Meanwhile, the detecting core members 2a, 2b constituting the DC current sensor were disposed and connected in a body around the lead wire being detected 1 of 8 mm outside diameter consisting of a vinyl coating, and finally, the lead wire being detected 1 was disposed through the detecting core 2.

As the result of measurement on output variations after removing an AC component of 11 Hz, by a low-pass filter, in an electromotive force (output) Vout of the detecting coil 3 outputted via a phase comparing circuit, when disposing current applying means, in which an oscillator producing an exciting current having the frequency two times the exciting current applied finally to the exciting coils 5a, 5b is disposed, the phase comparing circuit and the like on the exciting coils 5a, 5b and detecting coils 3a, 3b as the DC current sensor of the present invention, applying the exciting current (AC current) of f=3.5 kHz and 0.1 Arms to the exciting coils 5a, 5b for the phase difference of 90°, applying a sine wave Ac current of 11 Hz and 1 mA (at peak) to allow the detecting coils 3a, 3b to function as the modulation coil from the oscillator, and further applying a DC current I to the lead wire being detected in a range of α 100 mA, it has been confirmed that the approximately same measurement result as that shown in FIG. 9 can be obtained.

That is, similar to the DC current sensor shown in FIG. 1, also in the DC current sensor constituted as shown in FIG. 4, even though the detecting core can be divided, the error output due to the reciprocating current is very small and the sensitive measurement is possible.

What is claimed is:

1. A DC current sensor for detecting DC current in a lead wire without contacting the same comprising: a detecting core including an annular saturable magnetic material, for receiving the lead wire, said detecting core including a plurality of detecting core members adapted to be divided, at least, at one portion in a circumferential direction for disposing the lead wire therethrough, on one of said detecting core members, at least, a pair of annular exciting cores formed of saturable magnetic material having a core intersection inter-connected perpendicularly to the circumferential direction of said detecting core members, and being disposed oppositely in spaced relation with said detecting core members, so as to magnetically saturate a portion thereof by a magnetic flux produced substantially in the perpendicular direction against a magnetic flux in the circumferential direction, produced by the DC current flowing through said lead wire being detected, and to interrupt a magnetic path by the magnetic flux in the circumferential direction periodically, and further including exciting coils wound around the exciting cores, said respective exciting coils being connected for negative-phase excitation, and a detecting coil being wound around said exciting cores in a toroidal shape.

2. A DC current sensor in accordance with claim 1, wherein the exciting cores comprise adjacent pairs of rectangular cylindrical elements having adjoining wall portions disposed on opposite sides of said detecting core members.

3. A DC current sensor in accordance with claim 1, wherein each exciting coil is wound around adjoining wall portions of adjacent pair of exciting core members.

4. A DC current sensor in accordance with claim 1, wherein the detecting core member comprises, a pair of I-shaped detecting core members being connected by a portion of the exciting core in a body, and a U-shaped detecting core member formed in the body.

5. A DC current sensor in accordance with claim 4, wherein one end portion of the pair of I-shaped detecting core members is rotatably secured to one end portion of the U-shaped detecting core member in such a manner that, other end of the I-shaped detecting core members are operable to be freely opened and closed.

6. A DC current sensor in accordance with claim 1, wherein a balance volume of an exciting current is disposed between the pair of exciting coils.

7. A DC current sensor in accordance with claim 1, wherein the detecting core members and the exciting core members comprise permalloy.

8. A DC current sensor for detecting current in a lead wire without contacting the same comprising: a detecting core including an annular saturable magnetic material for receiving the lead wire said detecting core including a plurality of detecting core members adapted to be divided, at least, at one portion in a circumferential direction for disposing said lead wire therethrough, on one of said detecting core members, at least, a pair of exciting cores formed of saturable magnetic material forming an annular shape having a core intersection inter-connected perpendicularly to the circumferential direction of said detecting core members, and being disposed oppositely in spaced relation with said detecting core members, so as to magnetically saturate a portion of said detecting core members by a magnetic flux produced substantially in the perpendicular direction against a magnetic flux in the circumferential direction produced by the DC current flowing through said lead wire being detected, and to interrupt a magnetic path by the magnetic flux in the circumferential direction periodically, and further including exciting coils wound around the exciting cores, said respective exciting coils being connected such that an exciting current having the relative phase difference of 90° can be applied, the detecting coils being wound around said exciting cores in a toroidal shape, and said respective detecting coils being connected in series in a negative-phase.

9. A DC current sensor in accordance with claim 8, wherein exciting cores comprise two adjacent pairs of rectangular cylindrical members disposed on opposite sides of said detecting core members.

10. A DC current sensor in accordance with claim 8, wherein each exciting coil is wound around adjoining wall portions of the adjacent pairs of exciting core members.

11. A DC current sensor in accordance with claim 8, wherein the detecting core member comprises, a pair of I-shaped detecting core members connected by a portion of the exciting core in a body, and a U-shaped detecting core member formed in the body.

12. A DC current sensor in accordance with claim 11, wherein one end portion of the pair of I-shaped detecting core members is rotatably secured to one end portion of the U-shaped detecting core member in such a manner that, other end portions of the I-shaped detecting core members are operable to be freely opened and closed.

13. A DC current sensor in accordance with claim 8, wherein the 90° phase circuit of an exciting current is disposed between the pair of exciting coils.

14. A DC current sensor in accordance with claim 8, wherein the detecting core members and the exciting core members comprise permalloy.

* * * * *